(12) United States Patent
Iwanari

(10) Patent No.: US 6,522,567 B2
(45) Date of Patent: Feb. 18, 2003

(54) SEMICONDUCTOR MEMORY DEVICE AND SEMICONDUCTOR INTEGRATED DEVICE USING THE SAME

(75) Inventor: Shunichi Iwanari, Kyoto (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 8 days.

(21) Appl. No.: 09/874,833

(22) Filed: Jun. 5, 2001

(65) Prior Publication Data
US 2002/0024837 A1 Feb. 28, 2002

(30) Foreign Application Priority Data

Jun. 7, 2000 (JP) .......................... 2000-170878

(51) Int. Cl.[7] .............................................. G11C 11/22
(52) U.S. Cl. .................................. 365/145; 365/189.09
(58) Field of Search ................................. 365/145, 210, 365/205, 207, 189.01, 189.09

(56) References Cited

U.S. PATENT DOCUMENTS 5,815,431 A * 9/1998 Chen ........................... 365/145
5,835,399 A    11/1998 Jeon ............................ 365/145
6,084,795 A * 7/2000 Nunokawa ................... 365/145
6,359,819 B1 * 3/2002 McClure ...................... 365/145
6,392,916 B1 * 5/2002 Choi et al. .................... 365/145

FOREIGN PATENT DOCUMENTS

JP    9-282893    10/1997
JP    10-69789     3/1998

* cited by examiner

Primary Examiner—Vu A. Le
Assistant Examiner—Anh Phung
(74) Attorney, Agent, or Firm—Merchant & Gould P.C.

(57) ABSTRACT

A method and circuit are provided that can compensate for the various types of fatigue and degradation, including an imprint phenomenon, even under a variety of working conditions after a ferroelectric memory actually has been shipped as a product. The circuit includes a plurality of memory cell degradation detectors, a comparator, and a power supply circuit. Each of the memory cell degradation detectors has a plurality of data holding circuits that differ in capacitance ratio of a dummy bit line (Cb) to a dummy memory cell (Cs). The comparator compares signals from the memory cell degradation detectors to expected values. The power supply circuit changes a value of the voltage applied to the memory cell based on the signal from the comparator, provided as the result of comparison showing that the signals do not agree with the expected values. Thus, the fatigue and degradation of the ferroelectric memory cell can be detected so as to adjust the voltage to be applied to the memory cell during reading/writing.

16 Claims, 14 Drawing Sheets

SEMICONDUCTOR MEMORY DEVICE AND SEMICONDUCTOR INTEGRATED DEVICE USING THE SAME

BACKGROUND OF THE INVENTION

1. Field of the Invention

The present invention relates to a semiconductor memory device and a semiconductor integrated device using the same. In particular, the present invention relates to a technology that improves the data retention characteristics of a ferroelectric memory by detecting the degradation of the data retention characteristics and enabling sufficient data to be written so as to eliminate a deficiency in writing data into a memory cell because of such degradation.

2. Description of the Related Art

A nonvolatile, low-power, and high-speed ferroelectric memory has been a focus of attention, particularly since the early 1990s. The ferroelectric memory employs hysteresis characteristics, observed in the polarization-electric field characteristics of a ferroelectric material, as a memory cell.

FIG. 2 shows the hysteresis characteristics observed in the polarization-electric field characteristics (Q-V characteristics). In FIG. 2, the x-axis indicates electric field intensity (the magnitude of voltage), the y-axis indicates polarization (charge), and EC1 and EC2 indicate a coercive field (coercive voltage).

A ferroelectric without polarization (represented by "A" in FIG. 2) is polarized (represented by "B") by applying an electric field in the positive direction. The ferroelectric retains its polarization after the electric field has been removed, which is called residual polarization (represented by "C"). Next, when the electric field is applied in the negative direction, the ferroelectric is polarized in the opposite direction to the polarization caused by the positive electric field (represented by "D"). The ferroelectric retains its polarization after the electric field has been removed (represented by "E").

As shown in FIG. 2, the ferroelectric has the polarization even in the absence of an externally applied electric field (voltage). The ferroelectric can be used as a memory cell by taking two different states resulting from the residual polarization as 1 ("C") and 0 ("E"), respectively. A ferroelectric memory is a device that employs such a ferroelectric as a memory cell capacitor.

Next, as an example of the ferroelectric memory using a ferroelectric material for its memory cells, the configuration and operation of a ferroelectric memory including 2T/2C cells will be described.

FIG. 3A is a circuit diagram showing a cell circuit structure of the ferroelectric memory. FIG. 3B shows waveforms representing the operation of the ferroelectric memory in a cell plate line driving method.

In FIG. 3A, reference numeral 31 is a memory cell, 32 is a sense amplifier, WL is a word line, BL/XBL is a bit line pair for reading/writing data on the memory cell, CP is a cell plate line, and Ns is a ferroelectric memory cell (memory node).

The operation of the ferroelectric memory having the above configuration will be described with reference to FIG. 3B.

First, the word line WL is raised to a logic "H" level (t11). Thereafter, the cell plate line CP goes to "H" so that the memory cells Ns are selected (t12). When the CP is driven to the "H" level, the charge from the memory cells appears on the bit line pair BL/XBL. At this time, the charge is divided by a bit line pair capacitance Cb and a memory cell capacitance (also referred to as a ferroelectric capacitor) Cs, producing electric potential on the bit line pair BL/XBL.

Next, a sense amplifier activating signal SAE goes to "H" so that the sense amplifier is activated (t13). Thus, the potential difference of the bit line pair BL/XBL is amplified to VCC and VSS levels, thereby reading data and rewriting "L" data.

When the CP is lowered to an "L"(VSS) level, "H" data is rewritten into the memory cell. Finally, the WL is returned to "L", and thus the operation is completed.

FIG. 4 shows a hysteresis curve of the ferroelectric memory cell during a data read operation.

In FIG. 4, a potential level that appears on the bit line pair BL/XBL is determined by the shape of the hysteresis curve of the ferroelectric memory cell and a bit line pair capacitance Cb. The bit line pair capacitance Cb is represented by the slope of thick lines in FIG. 4. When the cell plate line CP goes to the "H" level, VCC potential is applied to the series capacitance of the ferroelectric capacitor and the bit line pair capacitance. Thus, the charge flows out of the ferroelectric capacitor to charge the bit line pair. The reading of data depends on the difference ΔV between a potential VH in reading "H" data and potential VL in reading "L" data. Therefore, a larger potential difference ΔV stabilizes the read operation.

The repetition of polarization reversal causes a ferroelectric to be fatigued and degraded, involving residual polarization loss or the like. The ferroelectric memory performs a destructive read operation. In addition, the fatigue and degradation of the ferroelectric due to polarization reversal occur in both read and write operations. This results in low reliability, such as a reduction in the data retention period and the inability to read and rewrite data.

In the ferroelectric memory, one of the phenomena of fatigue and degradation of a ferroelectric by repetitive read/write operations is called "imprint", where a hysteresis curve is shifted. FIG. 5 shows such an imprint phenomenon.

In FIG. 5, "I" is the hysteresis curve of a memory cell before imprint occurs, "H" is the hysteresis curve of the memory cell retaining data "1" after imprint, and "L" is the hysteresis curve of the memory cell retaining data "0" after imprint. For example, when data are read from the 2T/2C cell in the case of imprint, the read voltage is reduced to ΔV'(<0), compared with ΔV shown in FIG. 4. Thus, the sensitivity margin of the amplified data is decreased significantly, causing faulty operations. As a result, the data retention characteristics of the ferroelectric memory cell become poor.

Moreover, even in the absence of polarization reversal due to write/read operations, the imprint phenomenon occurs by maintaining the spontaneous polarization of a ferroelectric material in the predetermined direction (i.e., the ferroelectric material retains the predetermined data). This reduces residual polarization particularly because the imprint phenomenon causes a deficiency in writing opposite data. Thus, the sensitivity margin of the amplified data is decreased significantly, which leads to the degradation of data retention characteristics, resulting in low reliability.

FIGS. 6A and 6B show a phenomenon of deficiency in writing opposite data, including the coercive field movement (to a higher electric field) in the Q-V characteristics of a ferroelectric in the case of imprint. FIG. 6A shows the imprint phenomenon, where the ferroelectric retains data in the state of point C in FIG. 2. FIG. 6B shows the imprint phenomenon, where the ferroelectric retains data in the state of point E in FIG. 2.

When the imprint phenomenon occurs, the hysteresis curves in FIGS. 6A and 6B, each represented by a broken line, are shifted as indicated by the thick arrows to become the hysteresis curves represented by dotted and thick lines, respectively. The "shift" of the hysteresis curves increases the coercive field EC1 to EC1' in FIG. 6A and the coercive field EC2 to EC2' in FIG. 6B. To write sufficient data having the opposite logic to the retained data, it is necessary to apply the electric field (voltage) larger than that before the imprint phenomenon occurs to the ferroelectric capacitors as indicated by the thin arrows in FIGS. 6A and 6B. Also, to provide a sufficient read voltage $\Delta V$ for reading, the electric field (voltage) larger than that before the imprint phenomenon occurs is necessary, just as for writing.

To prevent low reliability caused by imprint, the "shift" of a hysteresis curve resulting from imprint is suppressed, and the occurrence of imprint is detected to correct such "shift" so that the original characteristics are restored, i.e., the imprint compensation is required.

For example, JP 10-69789 A discloses an imprint compensation circuit, whose block diagram is shown in FIG. 15. The operation of the circuit is as follows: after completion of a wafer process, data writing/reading tests are conducted to detect the occurrence of imprint; a high voltage greater than the supply voltage VCC is applied to a write enable (/WE) pad and output enable (/OE) pad from the outside of a chip; the high voltage is applied to both electrodes of a ferroelectric capacitor, thereby compensating for the "shift" of a hysteresis curve and restoring the normal hysteresis loop.

The above method of imprint compensation is effective upon completion of a wafer process. However, it cannot compensate for an imprint phenomenon that may occur under a variety of working conditions after the device actually has been shipped as a product.

SUMMARY OF THE INVENTION

Therefore, with the foregoing in mind, it is an object of the present invention to provide a method and circuit that can compensate for the various types of fatigue and degradation, including an imprint phenomenon, even under a variety of working conditions after a ferroelectric memory actually has been shipped as a product.

To achieve the above object, a first semiconductor memory device of the present invention includes a memory cell degradation detector having a first data holding circuit including an element formed of ferroelectric, a memory cell array having a second data holding circuit including an element formed of ferroelectric, and a power supply circuit portion for receiving an output signal from the memory cell degradation detector and supplying an internal supply voltage to the memory cell array. The power supply circuit portion changes a value of the internal supply voltage based on the output signal from the memory cell degradation detector.

According to the first semiconductor memory device, the amount of data (charge) output from a dummy memory cell for reference is detected to estimate the degradation of a ferroelectric memory cell by the most extreme stress in reading/writing data externally at random. When the result of the detection shows that the degradation is considered to have occurred by a certain amount of stress, the potential to be applied to the ferroelectric memory cell during reading/writing, where data are read and written externally at random, is adjusted to be large enough to cause polarization reversal readily. This makes the sufficient writing of data possible and prevents the degradation of data retention characteristics resulting from insufficient polarization reversal because of imprint or poor endurance, so that the reliability of data retention characteristics can be improved. Moreover, since the memory cell degradation detector operates in normal reading/writing, the device can compensate for the various types of fatigue and degradation, including an imprint phenomenon, even under a variety of working conditions after it actually has been shipped as a product.

In the first semiconductor memory device, it is preferable that the internal supply voltage has two or more values, and that the power supply circuit portion switches the values of the internal supply voltage successively based on the output signal from the memory cell degradation detector.

According to this configuration, the potential to be applied to the memory cell can be set precisely in accordance with the degree of degradation of the memory cell characteristics. This can prevent a higher voltage than necessary from being applied to the memory cell and the degradation of characteristics, caused by the high-voltage application to the memory cell, from being accelerated. Thus, the side effect of an increased voltage in writing data can be suppressed.

In the first semiconductor memory device, it is preferable that the value of the internal supply voltage is lower than that of an external supply voltage.

According to this configuration, the voltage to be applied to the memory cell can remain a low voltage. Therefore, the acceleration of degradation by the high-voltage application can be suppressed, and also current can be supplied sufficiently as well as responsively to the circuit that consumes a large amount of current, such as a cell plate or sense amplifier. Thus, this can provide improved reliability and high speed, compared with supplying a stepped-up potential from an external power supply VDD.

In the first semiconductor memory device, it is preferable that the first data holding circuit is provided with a plurality of data holding circuits, each of which includes a data holding element pair formed of ferroelectric and a data read line pair connected to each of the data holding element pair and has a different capacitance ratio of the data holding element pair to the data read line pair.

In the first semiconductor memory device, it is preferable that each of the data holding circuits has a different capacitance value of the data holding element pair or different capacitance value of the data read line pair.

In the first semiconductor memory device, it is preferable that the first data holding circuit includes a first data holding element pair formed of ferroelectric, a first data read line pair connected to each of the first data holding element pair, and a first data amplifier for receiving a signal through the first data read line pair; the second data holding circuit includes a second data holding element pair formed of ferroelectric, a second data read line pair connected to each of the second data holding element pair, and a second data amplifier for receiving a signal through the second data read line pair; the capacitance ratio of one element of the first data holing element pair to one line of the first data read line pair is the same as that of one element of the second data holding element pair to one line of the second data read line pair, and the capacitance ratio of the other element of the first data holding element pair to the other line of the first data read line pair is different from that of the other element of the second data holding element pair to the other line of the second data read line pair.

In this case, it is preferable that a capacitance value of one line of the first data read line pair is the same as that of one line of the second data read line pair, and that a capacitance value of the other line of the first data read line pair is smaller than that of the other line of the second data read line pair.

According to the above configuration, the degree of degradation progress of the memory cell characteristics can be detected successively by comparing data from the memory cell with an expected value, using the memory cell degradation detector. The memory cell degradation detector may include a plurality of data holding circuits, each having a different capacitance ratio (Cb/Cs) of a dummy bit line pair to a dummy memory cell; such a difference in capacitance ratio can be achieved, e.g., by providing the dummy bit line pairs with different wiring length or the dummy memory cells with different structure, based on the Q-V characteristics of the ferroelectric when imprint degradation is caused. Alternately, the memory cell degradation detector may include the data holding circuits, where one bit line of the dummy bit line pair has the same capacitance value and Cb/Cs as those of each line of the bit line pair in the memory cell array, and the other has a capacitance value and Cb/Cs different from those of each line of the bit line pair in the memory cell array, e.g., the Cb/Cs value of the other dummy bit line smaller than that in the memory cell array.

The application of potential that corresponds to the degree of degradation of the memory cell characteristics allows polarization reversal to be caused readily. This makes the sufficient writing of data possible and prevents the degradation of data retention characteristics resulting from insufficient polarization reversal because of imprint or poor endurance. Thus, the reliability of data retention characteristics can be improved. Moreover, this can prevent the imprint phenomenon in the dummy memory cell due to repetitive reading/writing from being restored.

In the first semiconductor memory device, it is preferable that the first data holding circuit includes a plurality of first data holding elements formed of ferroelectric and a plurality of data read lines connected to the first data holding elements, and that the reading/writing of data with respect to the first data holding elements are performed only when the power is turned on.

This configuration provides reference cells on which the reading/writing of data are performed only when the power is turned on. Therefore, the degradation of the memory cell by stress applied thereto when the power is on/off can be recreated and detected. Thus, the imprint degradation, including the degradation of data retention characteristics that occurs during the power-off period, can be detected.

In the first semiconductor memory device, it is preferable that the first data holding circuit includes a plurality of first data holding elements formed of ferroelectric and a plurality of data read lines connected to the first data holding elements, and that the reading/writing of data with respect to the first data holding elements are performed when the power is turned on and when data are read from and written into the memory sell array.

This configuration provides reference cells on which the reading/writing of data are performed when the power is turned on and each time data are read from and written into the ferroelectric memory cell, where data are read and written externally at random. Therefore, the degradation of the memory cell by the stress of poor characteristics resulting from repetitive polarization reversal and of data loss during the power-off period can be recreated and detected. Thus, the imprint degradation, including the degradation of data retention characteristics that occurs during the power-off period and the degradation by writing data into the memory cell, can be detected.

In the first semiconductor memory device, it is preferable that the first data holding circuit includes a first data holding element formed of ferroelectric, a first data read line connected to the first data holding element, a third data holding element formed of ferroelectric, and a third data read line connected to the third data holding element, and that the reading/writing of data with respect to the first data holding element are performed only when the power is turned on, while the reading/writing of data with respect to the third data holding element are performed when the power is turned on and each time data are read from and written into the memory cell array.

This configuration provides dummy memory cells for individual reference: the dummy memory cell on which the reading/writing of data are performed only when the power is turned on; the dummy memory cell on which the reading/writing of data are performed when the power is turned on and each time data are read from and written into the ferroelectric memory cell, where data are read and written externally at random. Therefore, the degradation of the memory cell by stress applied thereto when the power is on/off and the degradation by the stress of poor characteristics resulting from a write operation and of data loss during the power-off period can be recreated and detected in a chip. Thus, the imprint degradation by residual polarization during the power-off period and by reading/writing of data on the memory cell involving polarization reversal can be detected.

In the first semiconductor memory device, it is preferable that the first data holding circuit includes a first data holding element formed of ferroelectric, a first data read line connected to the first data holding element, a third data holding element formed of ferroelectric, and a third data read line connected to the third data holding element; the reading/writing of data with respect to the first data holding element are performed only when the power is turned on, while the reading/writing of data with respect to the third data holding element are performed when the power is turned on and each time data are read from and written into the memory cell array, and after the reading/writing of data with respect to the first and third data holding elements in turning the power on, a refresh operation is performed for the memory cell array.

According to this configuration, the imprint phenomenon that has occurred during the power-off period can be restored in such a manner that the refresh operation is performed for the memory cell array after completion of read/write operations on the reference cells when the power is turned on. Moreover, the data stored in the memory cell of the memory cell array, which have not been accessed during the time the power is on, are accessed at least once during the power-on period. Thus, the history of stress applied to the reference cells, where data are read and written only when the power is turned on, can correspond to the history of stress applied to the memory cells that are not accessed externally during the power-on period.

In the first semiconductor memory device, it is preferable that the data to be written into the first and third data holding elements are constant regardless of data input externally to the memory cell array.

According to this configuration, the data having a fixed value are written into the reference cells, e.g., an internal supply voltage VINT1 is written into one line of the bit line pair and VSS is written into the other line, allowing the reference cells to cause imprint readily. Therefore, the degradation of the memory cell array by stress, where data are read and written externally at random, can be recreated and detected. Moreover, only VSS is written into both of the complementary bit lines, which can prevent the imprint phenomenon in the dummy memory cell from being restored.

In the first semiconductor memory device, it is preferable that the power supply circuit portion includes an input circuit for recognizing a voltage level of an external signal, a first means for outputting the internal supply voltage to the outside of a chip, and a second means for transmitting the internal supply voltage to the first means based on an output signal from the input circuit, and that a value of the internal supply voltage is changed in accordance with the voltage level of the external signal.

This configuration provides a test circuit, whose operation mode can be set externally, in the power supply circuit portion. Therefore, the correlation between the degree of degradation progress and the power supply voltage level can be taken before applying stress in advance. Thus, the potential within a chip that is changed according to the degree of degradation progress is confirmed even after assembly by sealing, so that the degree of degradation can be confirmed by this potential. Moreover, since the level of the internal supply voltage can be set arbitrarily from the outside of a chip, any voltage stress can be applied externally to the memory cell array. Thus, the resistance of the ferroelectric memory cell itself to stress can be evaluated. In addition, the testing and screening of a device (chip) with poor characteristics in terms of reliability can be conducted in the following manner: the output of the data holding circuit or the power supply voltage level are monitored during testing so as to detect the degree of fatigue and degradation of the ferroelectric memory cell.

To achieve the above object, a second semiconductor memory device of the present invention includes: a memory cell array having a plurality of data holding elements formed of ferroelectric and a plurality of data read lines connected to the data holding elements; a first data amplifier connected to the data lead lines, for outputting data of the data holding elements to the outside; a first power supply circuit; a second data amplifier for receiving an output signal from the first power supply circuit and signals through the data read lines, and a second power supply circuit for receiving an output signal from the second data amplifier and supplying an internal supply voltage to the memory cell array. The second power supply circuit changes a value of the internal supply voltage based on the output signal from the second data amplifier.

The second semiconductor memory device provides a sense amplifier for reading data in addition to a sense amplifier for transmitting data. Therefore, the degradation of the memory cell itself by stress can be detected, the memory cell being selected randomly for reading/writing data externally. When it is assumed that the occurrence of degradation by a certain amount of stress makes it difficult to cause polarization, the potential to be applied to the memory cell in rewriting data and writing externally input data is adjusted to be large enough to cause polarization reversal satisfactorily, and thus data can be written. Consequently, the characteristics in terms of reliability can be improved.

To achieve the above object, a semiconductor integrated device of the present invention includes a plurality of the first or the second semiconductor memory devices. The semiconductor integrated device further includes a selecting circuit, to which data signals from the semiconductor memory devices are coupled, for selecting any one of the semiconductor memory devices and a control circuit for controlling the selecting circuit so that an unselected semiconductor memory device is selected based on the data signal from the semiconductor memory device selected by the selecting circuit.

This semiconductor integrated device includes a plurality of ferroelectric memories that can output signals for detecting degradation to the outside and a ferroelectric memory controller that selects and operates the ferroelectric memory to be used. Therefore, the semiconductor integrated device can detect the ferroelectric memory whose characteristics have been degraded under a variety of working conditions, stop that ferroelectric memory operating, and employ unused ferroelectric memory instead.

These and other advantages of the present invention will become apparent to those skilled in the art upon reading and understanding the following detailed description with reference to the accompanying figures.

DESCRIPTION OF THE PREFERRED EMBODIMENTS

Hereinafter, the preferred embodiments of the present invention will be described with reference to the accompanying drawings.

First Embodiment

Figure 1:
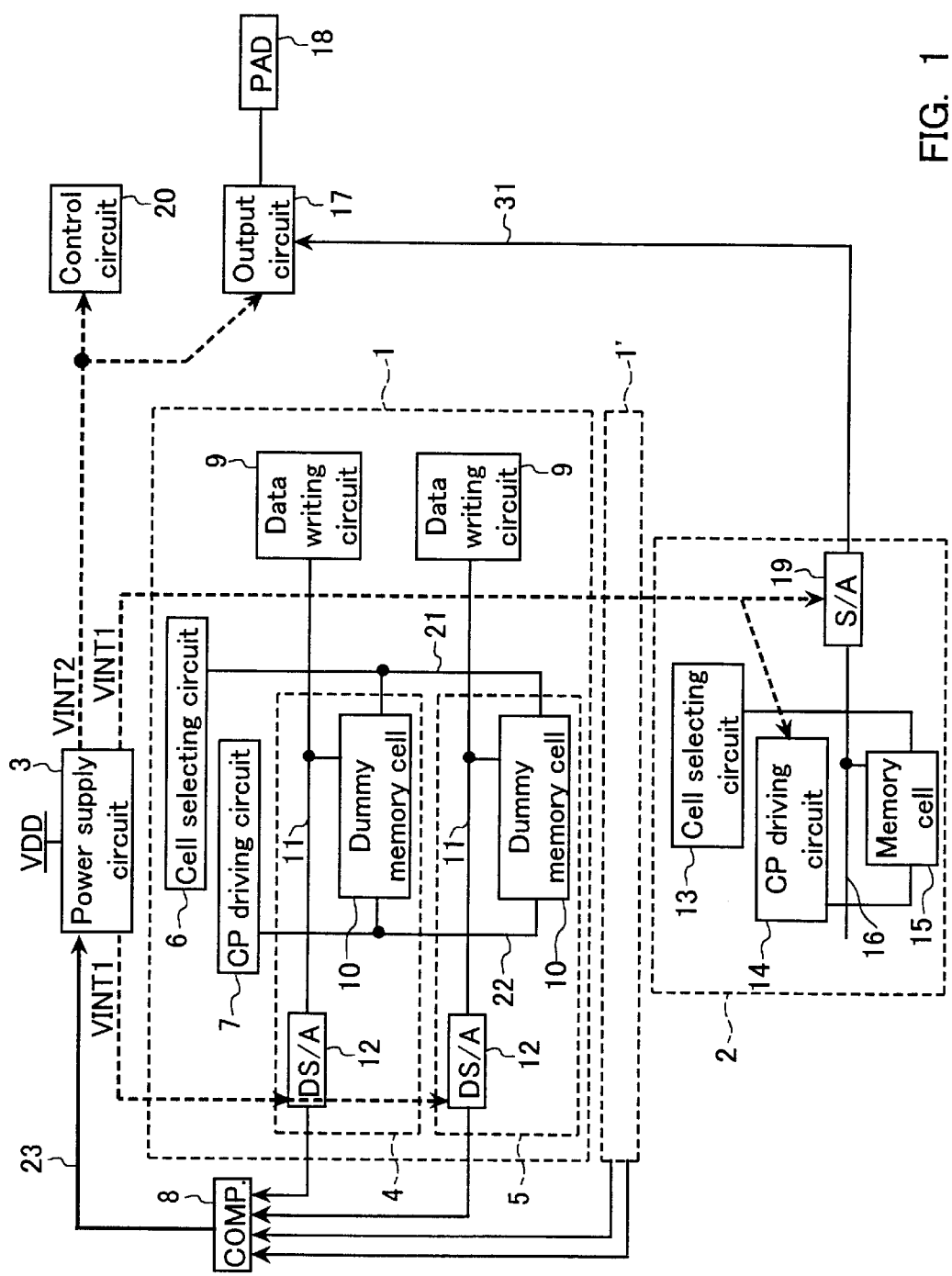
FIG. 1 is a block diagram showing an example of the configuration of a semiconductor memory device of a first embodiment of the present invention.
Figure 2:
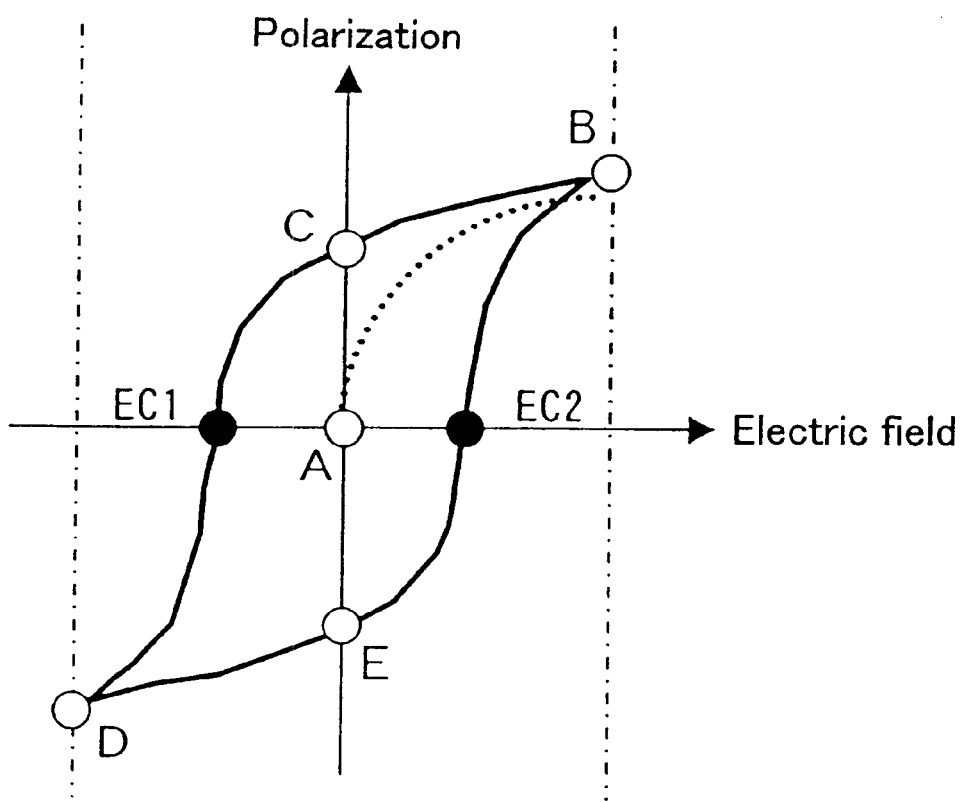
FIG. 2 shows the polarization-electric field (hysteresis) characteristics of a ferroelectric.

FIG. 1 is a block diagram showing an example of the configuration of a semiconductor memory device of a first embodiment of the present invention.

Referring to FIG. 1, a semiconductor memory device of this embodiment includes a plurality of memory cell degradation detectors 1, 1', a memory cell array 2, a power supply circuit 3, and a comparator (COMP.) 8. The memory cell degradation detectors 1, 1' detect the degradation of data retention characteristics of a ferroelectric memory cell. The memory cell array 2 retains data. The power supply circuit 3 supplies an internal supply voltage. The comparator 8 compares the output data from the memory cell degradation detectors 1, 1' with an expected value.

The memory cell degradation detector 1 includes data holding circuits 4, 5, dummy memory cell selecting circuit 6 (hereinafter, referred to as a cell selecting circuit), a cell plate (CP) driving circuit 7 for dummy memory cells, and data writing circuits 9 for applying write data to the dummy memory cells 10, which will be described later. Each of the data holding circuits 4, 5 includes the dummy memory cell 10, a dummy bit line pair 11 that is connected to the dummy memory cell 10 so as to read data stored therein, and a dummy sense amplifier (DS/A) 12 that amplifies data in the dummy memory cell 10 via the dummy bit line pair 11.

Here, the data holding circuits 4 and 5 differ in the ratio of the capacitance Cb of the dummy bit line pair 11 to the capacitance Cs of the dummy memory cell 10 (Cb/Cs).

The memory cell array 2 includes a cell selecting circuit 13, a cell plate (CP) driving circuit 14, a memory cell 15, a bit line pair 16 that is connected to the memory cell 15 to read data stored therein, and a sense amplifier (S/A) 19 that amplifies data in the memory cell 15 via the bit line pair 16 and outputs the data to an external pad (PAD) 18 via a data line 31 and an output circuit 17.

The power supply circuit 3 steps down the external power supply VDD and supplies a plurality of internal supply voltages, such as VINT1 and VINT2, to the inside of a chip. The internal supply voltage VINT1 is supplied to the memory cell degradation detectors 1, 1' and the memory cell array 2. The internal supply voltage VINT2 is supplied to the circuits other than the memory cell degradation detectors 1, 1' and the memory cell array 2, e.g., the output circuit 17 and a control circuit 20.

Next, the operation of a semiconductor memory device having the above configuration will be described.

First, when the power is turned on, the data holding circuits 4, 5 are selected and activated by a control signal from the control circuit 20. Then, two or more dummy memory cells 10 are selected through select lines 21, 22, and data are read from the dummy memory cells 10 to the dummy bit line pair 11. At this time, the memory cell 15 of the memory cell array 2 is neither selected nor activated.

The data read onto the dummy bit line pair 11 are amplified by the respective dummy sense amplifiers 12 of the data holding circuits, which then are transmitted to the comparator 8. The comparator 8 compares the data with an expected value. When the data do not agree with the expected value, the comparator 8 causes an output signal 23 to transit.

The power supply circuit 3 increases the internal supply voltage VINT1 according to the transition of the output signal 23 from the comparator 8. At this time, the internal supply voltage VINT2 is not changed.

After confirming the need to change the level of the internal supply voltage VINT1 by reading data from the dummy memory cells 10 when the power is turned on, a so-called refresh operation is performed. The refresh operation is such that all data in the memory cell 15 of the memory cell array 2 are once read, then amplified by the sense amplifier 19, and rewritten into the memory cell. The internal supply voltage VINT1 has been changed to have a potential level based on the output signal 23 by the time the refresh operation is performed.

After the power is turned on, data are input/output externally on the memory cell array 2. At this time, the data holding circuits 4, 5 are also selected corresponding to the operation of the memory cell array 2. Consequently, data are read from the dummy memory cells 10, and the data writing circuits 9, used for the dummy memory cells only, write data. As with the time of turning the power on, data read from the dummy memory cells 10 are amplified by the respective dummy sense amplifiers 12 of the data holding circuits 4, 5, which then are transmitted to the comparator 8. The comparator 8 compares the data with an expected value. When the data do not agree with the expected value, the comparator 8 causes the output signal 23 to transit. The power supply circuit 3 increases the internal supply voltage VINT1 according to the transition of the output signal 23. At this time, the internal supply voltage VINT2 is not changed.

Here, a degradation detecting operation of the memory cell degradation detector 1 will be described.

Each of the data holding circuits 4, 5 of the memory cell degradation detector 1 has a different Cb/Cs ratio. This can be achieved, e.g., in such manner that the dummy bit line pairs 11 in the data holding circuits 4, 5 differ in wiring length, or the dummy memory cells 10 include capacitors of different size.

The dummy memory cells 10 of the data holding circuits 4, 5, each having a different Cb/Cs ratio, are subjected to the same stress as that applied to the memory cell 15 of the memory cell array 2. The degree of degradation progress is judged by the data holding circuits 4, 5 having the sensitivity difference between the dummy sense amplifiers 12 resulting from different Cb/Cs ratios, i.e., having Cb/Cs values, with which they can output data equal to the expected values.

Now, a method for detecting the degradation based on the difference in Cb/Cs ratio will be described with reference to FIGS. 7A and 7B.

Figure 7A:
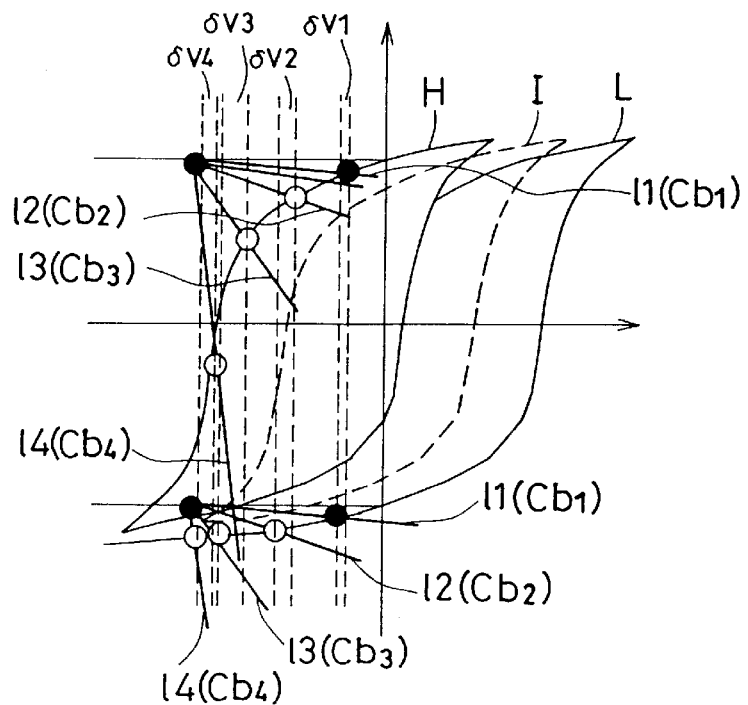
FIG. 7A shows the relationship between Cb on a hysteresis curve and read voltage $\delta V$ when an imprint phenomenon occurs, for the purpose of explaining the principle of a memory cell degradation detector of a first embodiment of the present invention.
Figure 7B:
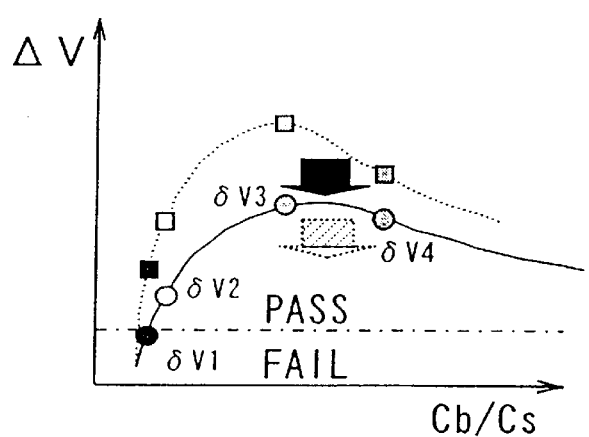
FIG. 7B shows the relationship between a Cb/Cs ratio and a read voltage $\Delta V$ when an imprint phenomenon occurs.

In FIG. 7A, "I" is a hysteresis curve before an imprint phenomenon occurs, "H" is a hysteresis curve after the imprint phenomenon caused by "H" data retention, and "L" is a hysteresis curve after the imprint phenomenon caused by "L" data retention. The slope of straight lines 11 to 14 shows the capacitance of the dummy bit line pair 11, indicated by Cb1 to Cb4. The capacitance value increases with the number of Cb. The capacitance Cb1 to Cb4 correspond to the read voltage δV1 to δV4, respectively. FIG. 7B is a graph showing the read voltage (δV1 to δV4) over the Cb/Cs ratio (Cb1/Cs to Cb4/Cs).

When an imprint phenomenon occurs, the hysteresis curve is shifted, causing a reduction in the read voltage, particularly for smaller Cb values. Thus, a read margin is decreased. This embodiment utilizes such an aspect to detect the degree of the progress of imprint degradation. Specifically, e.g., the memory cell degradation detector 1 includes the data holding circuits having Cb values ranging from Cb1 to Cb3. The read data from these circuits are compared with an expected value so as to evaluate the data holding circuit that has provided data not equal to the expected value. As a result, the imprint phenomenon corresponding to the Cb value of this data holding circuit is considered to have progressed.

Next, a method for applying stress to the dummy memory cells 10 of the data holding circuits 4, 5, each having a different Cb/Cs ratio, will be described. The degree of stress to be applied is substantially the same as that applied to the memory cell 15 of the memory cell array 2.

Each of the memory cell degradation detectors 1, 1' includes a plurality of data holding circuits 4, 5, each having a different Cb/Cs ratio. Here, the memory cell degradation detectors are classified into two types: the detector 1 for reading data only when the power is turned on; the detector 1' for reading data when the power is turned on and data are input/output externally.

The memory cell degradation detector 1 for reading data only at the time the power is on can detect the imprint phenomenon that occurs mainly when the write data are retained with the power turned off. On the other hand, the memory cell degradation detector 1' for reading data at the time the power is on and data are input/output externally can detect the imprint phenomenon that is applied, along with polarization reversal degradation (endurance) by external input/output access of data.

Figure 3A:
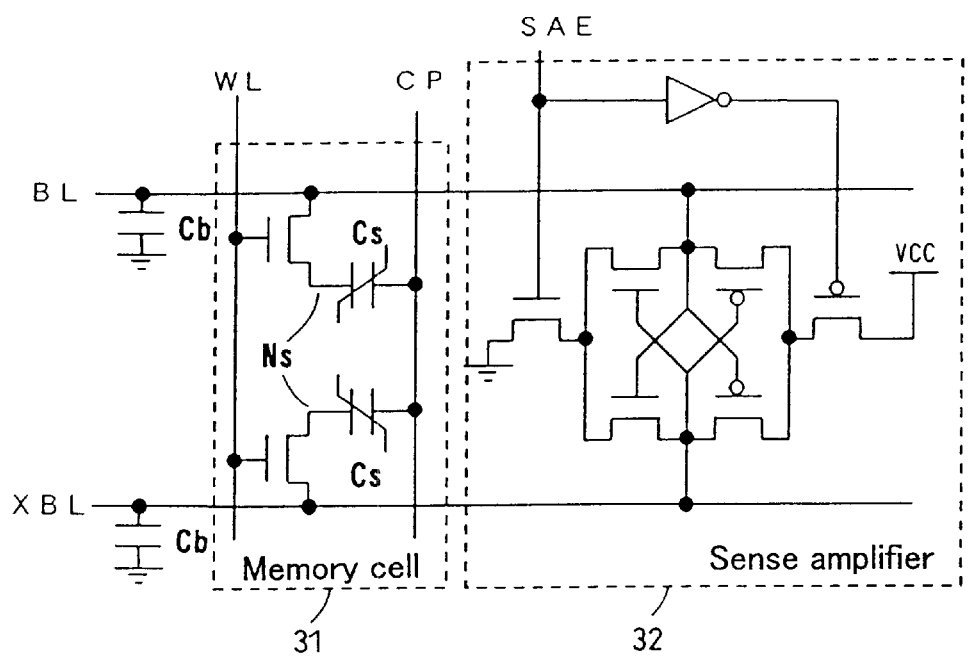
FIG. 3A shows a cell circuit structure of a ferroelectric memory.
Figure 3B:
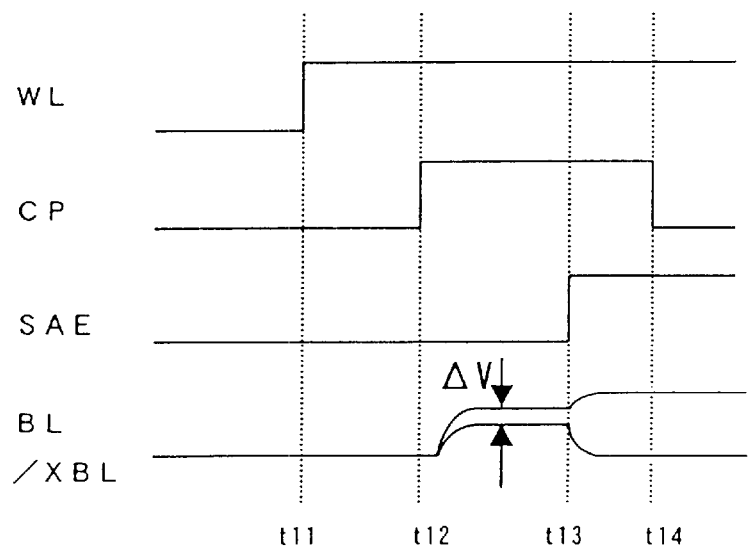
FIG. 3B shows the operation of a ferroelectric memory in a cell plate line driving method.
Figure 4:
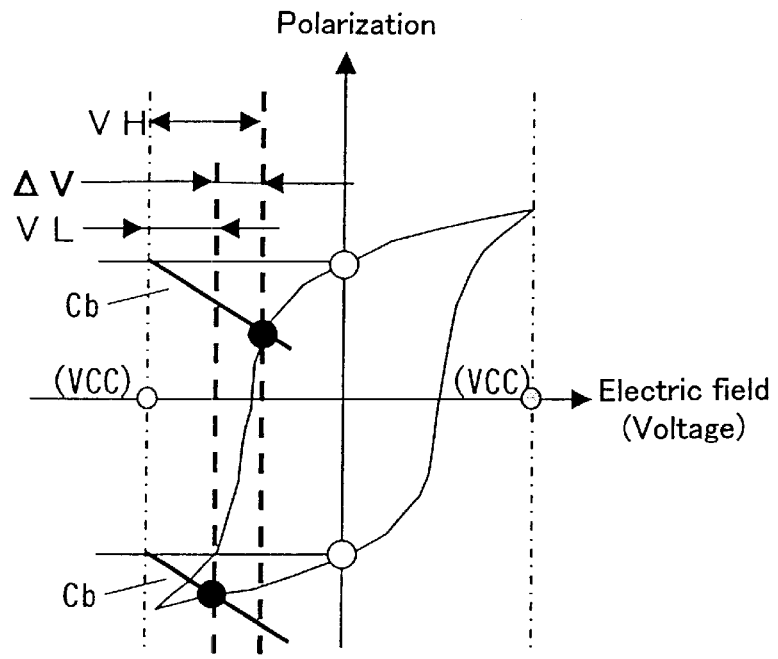
FIG. 4 shows the relationship between a hysteresis curve of a ferroelectric memory cell during data read operation and a read potential.
Figure 5:
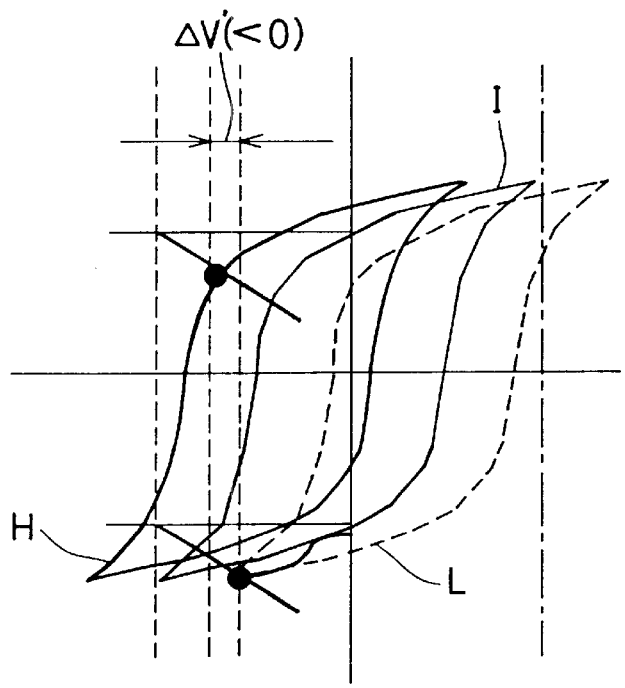
FIG. 5 shows an imprint phenomenon represented by a hysteresis curve.

After data are read according to the above two patterns, the data writing circuits 9 write data. At this time, certain data are written into the dummy memory cells 10. The write operation into the dummy memory cells 10 is the same as the normal write operation into the memory cell 15, as shown in FIG. 3B. The reason for writing the certain data is that the continuous application of an electric field to a ferroelectric memory cell in the same direction promotes the progress of imprint degradation. The promotion of degradation progress is one of the normal stresses to which the memory cell 15 is subjected.

Each of the dummy bit line pairs 11 in the data holding circuits 4, 5 includes two complementary bit lines. In the data holding circuits 4, 5 of the memory cell degradation detectors 1, 1' of this embodiment, the following methods are employed: the first one is such that the dummy bit line pairs 11, each pair having the same capacitance, are connected to the respective dummy memory cells 10 so that complementary data are written and retained; the second one is such that the dummy bit line pairs 11, each pair having different capacitance, are connected to the respective dummy memory cells 10 so that the same data are written and retained.

Here, the second method offers an effect different from that of the first method particularly by writing only "L" data. In the first method for writing complementary data, the imprint phenomenon is eliminated particularly in the memory cell into which "H" data are written, and sometimes the hysteresis is restored. This is not suitable for the dummy memory cells 10 to be used for recreating stress, because the stress cannot be recreated on the memory cell, where data have been written once and thereafter neither read nor write operation is performed. On the other hand, in writing only "L" data, the hysteresis is not restored by the recovery of the imprint phenomenon. Therefore, the stress can be recreated on the memory cell, where data have been written once and thereafter neither read nor write operation is performed, by combining with a refresh operation. As mentioned before, the refresh operation is performed for all the memory cells when the power is turned on.

Figure 8A:
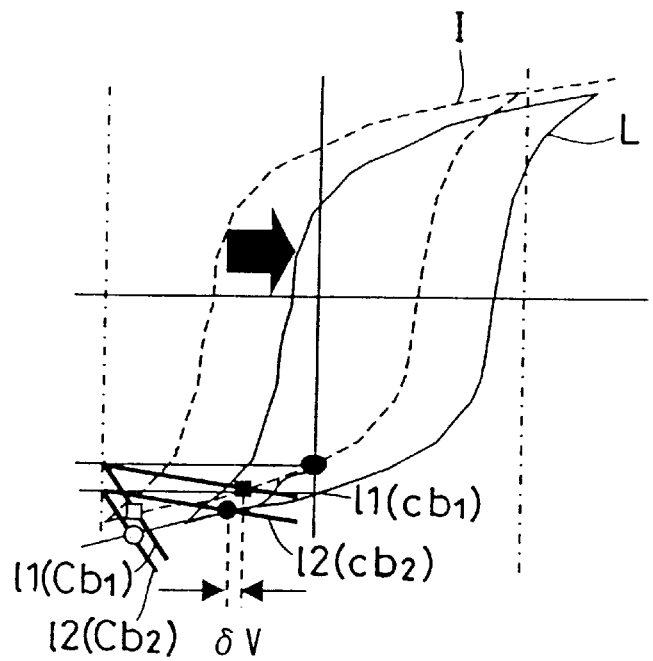
FIG. 8A shows the principle of detecting the degradation with a stress application method by writing only "L" data.
Figure 8B:
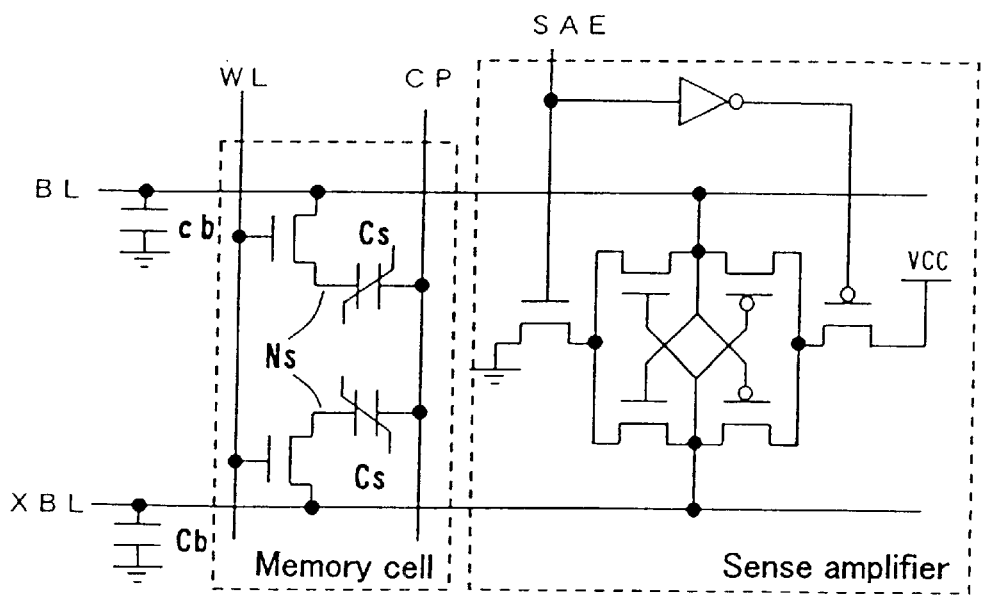
FIG. 8B shows the schematic configuration of a memory cell degradation detector used in FIG. 8A.

FIG. 8A shows the principle of detecting the degradation in the case where the same "L" data instead of "H" data are written into both dummy memory cells 10, to which the dummy bit line pairs 11 are connected, respectively. FIG. 8B shows the circuit structure of the same.

In FIG. 8A, "I" is a hysteresis curve before an imprint phenomenon occurs and "L" is a hysteresis curve after the imprint phenomenon caused by writing "L" data. The "shift" of the hysteresis curve due to the imprint phenomenon can be detected with read sensitivity based on the difference between cb1/Cs and cb2/Cs, indicated by δV in FIG. 8A. Specifically, such "shift" shown in FIG. 8A can be detected with the sense amplifiers 12 of the data holding circuits 4, 5 by forming the circuit structure in FIG. 8B as follows: one dummy bit line XBL has the same capacitance Cb as that of the bit line pair 16 in the memory cell array 2, and the other dummy bit line BL has a capacitance Cb smaller than the capacitance Cb of the dummy bit line XBL.

The power supply circuit 3 receives the output signal 23 of the comparator 8, e.g., after an amplifying operation is completed by the sense amplifier 19 of the memory cell array 2, and then increases the level of the internal supply voltage VINT1. In other words, the power supply circuit 3 increases the level of the internal supply voltage VINT1 before starting the next cycle, in which the memory cell degradation detector 1 compares data from the dummy memory cells 10.

Figure 6A:
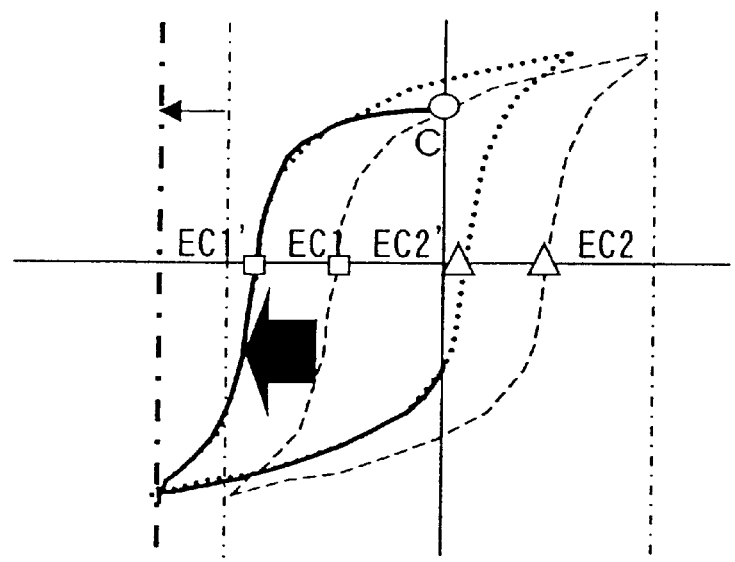
FIG. 6A shows an imprint phenomenon caused by "H" data retention.
Figure 6B:
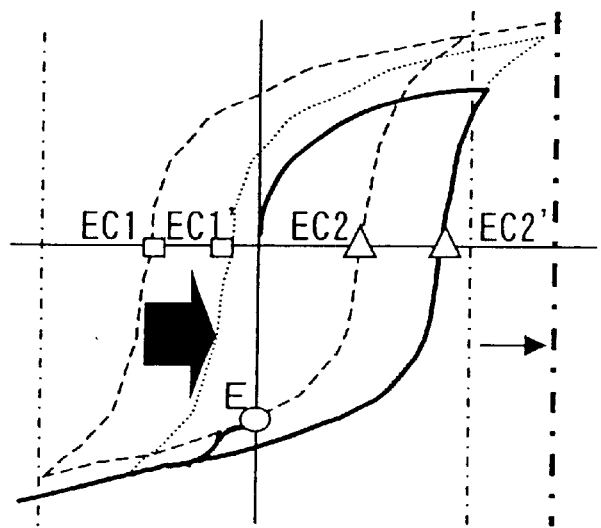
FIG. 6B shows an imprint phenomenon caused by "L" data retention.

From the next external data input/output cycle, the cell plate driving circuits 7, 14 and the sense amplifiers 12, 19, using the internal supply voltage VINT1 as a supply voltage, operate with the internal supply voltage VINT1 having a potential level higher than that required for the previous cycle, based on the result of the memory cell degradation detector 1. Consequently, as shown in FIG. 6, the potential applied to the memory cells while reading data is increased. Also, the voltage applied to the memory cells while writing data is higher than that in the previous cycle.

By adding a redundancy function to the data holding circuits 4, 5 of the memory cell degradation detectors 1, 1', the products initially having a process defect or characteristic defect can be removed and replaced, allowing for the improvement of reliability of the memory cell degradation detector itself.

As described above, this embodiment provides a plurality of memory cell degradation detectors 1, 1' including a plurality of data holding circuits 4, 5, each having a different Cb/Cs ratio, and the power supply circuit 3 that changes a value of the voltage applied to the memory cell based on signals from the memory cell degradation detectors 1, 1'. Thus, the fatigue and degradation of the ferroelectric memory cell can be detected so as to adjust the applied voltage to the memory cell during reading/writing.

As a result, the polarization reversal of the ferroelectric memory cell while reading/writing data can be performed sufficiently, even after the memory cell characteristics have been degraded by imprint or the like. This ensures the rewriting of data as well as the period of data retention.

In this embodiment, the power supply circuit 3 is provided in the ferroelectric memory. However, the present invention is not limited thereto. When a chip does not include a power supply circuit, which is supplied with two or more power sources from the outside of the chip, e.g., for a ferroelectric memory built-in LSI, the above effect according to this embodiment can be obtained by supplying the output signal of the comparator to the external power supply circuit.

Second Embodiment

Figure 9:
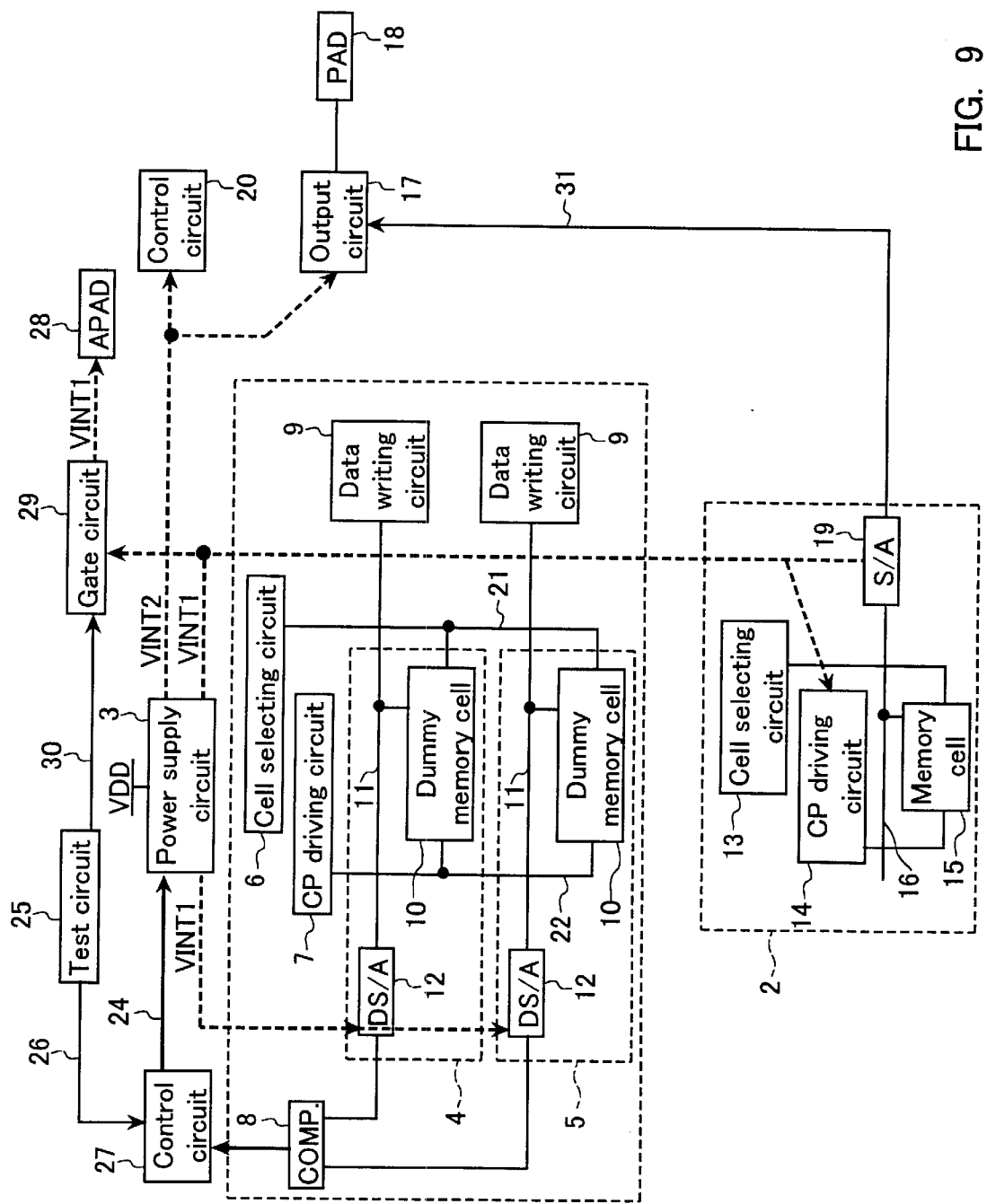
FIG. 9 is a block diagram showing an example of the configuration of a semiconductor memory device of a second embodiment of the present invention.

FIG. 9 is a block diagram showing an example of the configuration of a semiconductor memory device of a second embodiment of the present invention.

Referring to FIG. 9, a semiconductor memory device of this embodiment includes a single memory cell degradation detector 1, a memory cell array 2, a power supply circuit 3, a test circuit 25, a control circuit 27, and a gate circuit 29. The memory cell degradation detector 1 detects the degradation of data retention characteristics of a ferroelectric memory cell. The memory cell array 2 retains data. The power supply circuit 3 supplies an internal supply voltage. The test circuit 25 allows a signal 24 to be controlled externally, the signal 24 determining the internal supply voltage VINT1 output from the power supply circuit 3. The control circuit 27 receives an output signal 26 from the test circuit 25 and generates the signal 24. The gate circuit 29 connects the power supply circuit 3 and a pad portion, e.g., an address pad (APAD) 28.

In addition to outputting the signal 26 to the control circuit 27, the test circuit 25 outputs a signal 30 to the gate circuit 29.

The memory cell degradation detector 1 and the memory cell array 2 have the same configuration as those in the first embodiment, except that the memory cell degradation detector 1 includes a comparator 8. Thus, the description will be omitted here.

Next, the operation of a semiconductor memory device having the above configuration will be described.

During normal operations, the test circuit 25 does not operate, and the internal supply voltage VINT1 is separated from the pad 28 by the gate circuit 29. On the other hand, in a test mode, the test circuit 25 is set, e.g., by way of command input, so that any one of the first, second, and third test modes can be selected according to the input command.

The first test mode is described below.

In the first test mode, the internal supply voltage VINT1 output from the power supply circuit 3 is transmitted to the pad 28 through the gate circuit 29, which is controlled with the output signal 30 from the test circuit 25. In the first test mode, the output signal 30 from the test circuit 25 completely deactivates the circuit that uses the pad 28 as an external signal input portion during normal operations, e.g., an address input circuit in the case where an address input pad is used. This prevents the through current from being generated and the internal supply voltage VINT1 from entering the inside via address-related circuits.

Using the first test mode allows the level of the internal supply voltage VINT1 to be detected externally, e.g., through the address pin of a chip, even after assembly by sealing.

Next, the second test mode is described below.

During normal operations, the memory cell degradation detector 1 detects the degree of degradation of memory cells. In other words, a plurality of data holding circuits 4, 5, each having a different Cb/Cs value, provided in the memory cell degradation detector 1 recognize the condition of reading data from the dummy memory cells 10. Specifically, the data holding circuits that cannot read data, ranging in Cb/Cs value from a small value to greater values, are recognized; the read margin of those circuits is reduced with the progress of degradation of the dummy memory cells 10. Based on this result, the level of the internal supply voltage VINT1 is determined by using the output signal 24 of the control circuit 27.

In the second test mode, like the first test mode, the internal supply voltage VINT1 output from the power supply circuit 3 is transmitted to the pad 28 through the gate circuit 29. In addition, the level of the internal supply voltage VINT1 can be changed with the output signal 24 of the control circuit 27 that has received instructions from the test circuit 25.

In the second test mode as well, the output signal 30 from the test circuit 25 completely deactivates the circuit that uses the pad 28 as an external signal input portion during normal operations, e.g., an address input circuit in the case where an address input pad is used. This prevents the through current from being generated and the internal supply voltage VINT1 from entering the inside via address-related circuits.

Finally, the third test mode is described below.

In the third test mode, a signal 24 output from the control circuit 27 at the time of detecting the degradation is controlled from the outside of a chip so as to change the level of the internal supply voltage VINT1.

In the third test mode, like the second test mode, the level of the internal supply voltage VINT1 can be changed with the output signal 24 of the control circuit 27 that has received instructions from the test circuit 25. However, the internal supply voltage VINT1 output from the power supply circuit 3 is separated from the pad 28 by the gate circuit 29.

In the third test mode, like the second test mode, the level of the internal supply voltage VINT1 is determined by the input command for setting a test mode. However, unlike the first and second test modes, the internal supply voltage VINT1 is separated from the pad 28. Consequently, the normal operations can be performed internally while externally setting a data write voltage to be applied to the memory cell. Thus, accelerated tests on the reliability against fatigue and degradation of the memory cell can be conducted, which can shorten the time required for reliability evaluation.

As described above, in this embodiment, using the first test mode makes it possible to monitor the degree of fatigue and degradation by the level of the internal supply voltage VINT1 output from the power supply circuit 3. Thus, the degree of the progress of fatigue and degradation caused by imprint can be confirmed easily from the outside of a chip, even after assembly by sealing. Moreover, the degree of degradation progress can be confirmed successively in the course of evaluation, while the outcome of the long-term reliability evaluation conventionally is needed to ensure the condition of a processed ferroelectric. Therefore, the feedback of a problem in a faulty process can be provided early, so that the reliability can be confirmed early as well.

Also, using the second test mode makes it possible to set the level of the internal supply voltage VINT1 output from the power supply circuit 3 externally through the test circuit 25. Thus, the correlation between the Cb/Cs value for detecting the degradation required in the first test mode and the level of the internal supply voltage VINT1 then generated can be confirmed for each chip.

Furthermore, using the third test mode makes it possible to set a data write voltage to be applied to the memory cell externally. Thus, accelerated tests on the reliability against fatigue and degradation of the memory cell can be conducted from the outside of a chip, which can shorten the time required for reliability evaluation. In addition, the reliability of the cell itself can be confirmed by applying a high voltage to the ferroelectric memory cell alone.

The testing and screening of a device (chip) with poor characteristics in terms of reliability can be conducted in the following manner: data holding circuits having extremely small Cb/Cs values are used as the data holding circuits 4, 5; simple voltage stress is applied externally to the ferroelectric memory cells of those data holding circuits; the outputs of the data holding circuits or the power supply voltage level are monitored during testing so as to detect the degree of fatigue and degradation of the ferroelectric memory cells.

Third Embodiment

Figure 10:
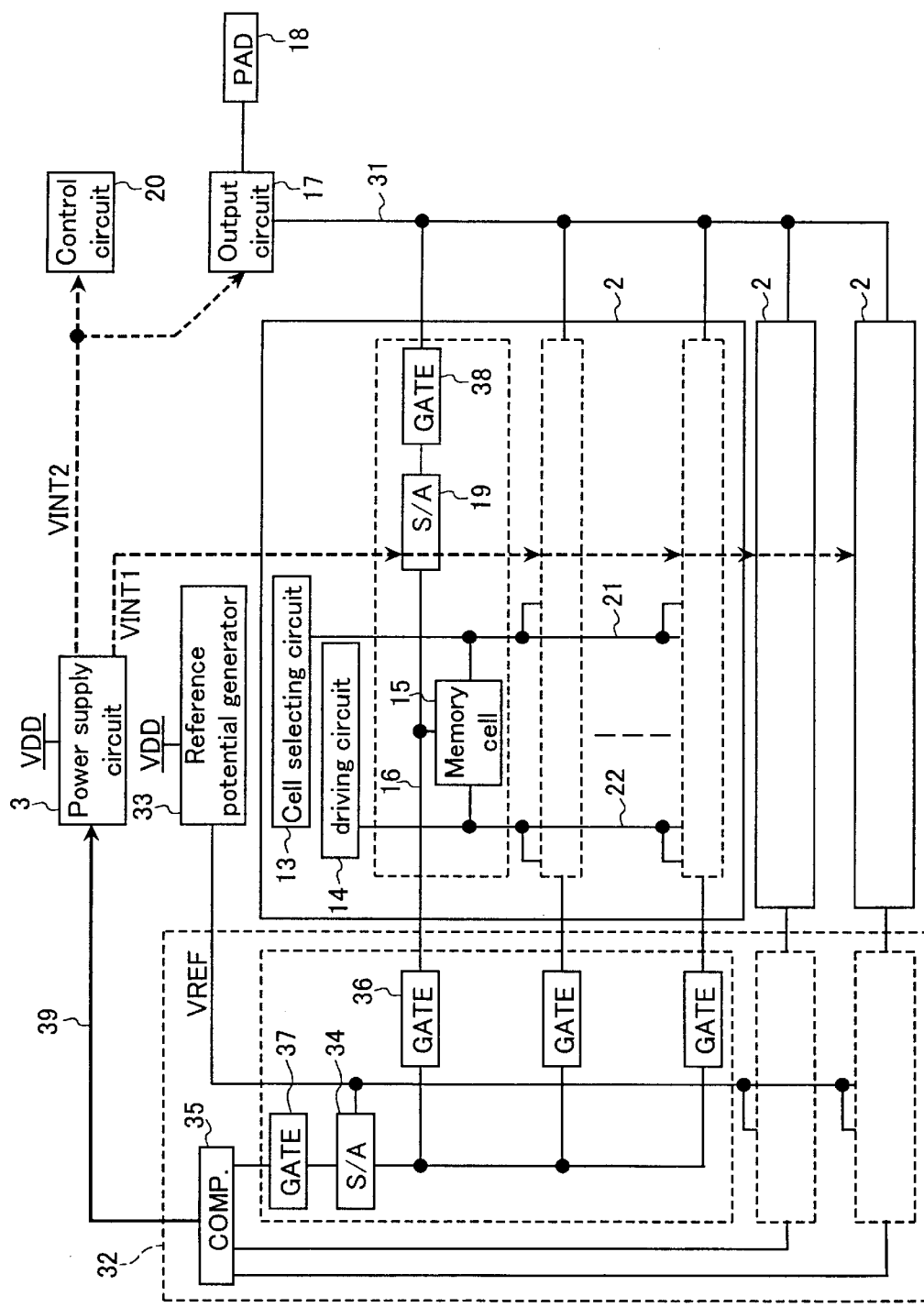
FIG. 10 is a block diagram showing an example of the configuration of a semiconductor memory device of a third embodiment of the present invention.

FIG. 10 is a block diagram showing an example of the configuration of a semiconductor memory device of a third embodiment of the present invention.

Referring to FIG. 10, a semiconductor memory device of this embodiment includes memory cell arrays 2, a memory cell degradation detector 32, a power supply circuit 3, and a reference potential generator 33. The memory cell arrays 2 retain data. The memory cell degradation detector 32 detects the degradation of data retention characteristics of the memory cell arrays 2. The power supply circuit 3 supplies an internal supply voltage.

Each of the memory cell arrays 2 includes a memory cell 15, a sense amplifier (S/A) 19 that transmits data read from the memory cell 15 to an output circuit 17 via a data line 31, and a gate (GATE) 38 that connects the data line 31 and the sense amplifier 19.

The memory cell degradation detector 32 includes a sense amplifier (S/A) 34, a comparator (COMP.) 35, and gate circuits (GATE) 36, 37. The sense amplifier 34 reads data from the memory cell 15 differently to the sense amplifier 19. The comparator 35 compares the read data of the sense amplifier 34 with an expected value. The gate circuits 36, 37 separate the sense amplifier 34 from the sense amplifier 19 and the comparator 35, respectively.

Like the first embodiment, the power supply circuit 3 outputs a plurality of internal supply voltages, such as VINT1 and VINT2. The internal supply voltage VINT1 is supplied to the memory cell arrays 2. The internal supply voltage VINT2 is supplied to the circuits other than the memory cell arrays 2, e.g., the output circuit 17 and a control circuit 20.

The reference potential generator 33 generates a reference potential VREF for the sense amplifier 34 of the memory cell degradation detector 32.

Next, the operation of a semiconductor memory device having the above configuration will be described.

When data are read from the memory cell array 2, the sense amplifier 34 and the gates 36, 37 are selected in the same manner as that for the sense amplifier 19 and the gate 38.

First, the gate 36 is selected to connect a bit line pair 16 and the sense amplifier 34. Then, data are read from the memory cell 15, which then are amplified by the sense amplifier 19. The gate 36 is closed between the reading of data and the beginning of the amplification by the sense amplifier 19, so that the sense amplifier 34 is separated from the sense amplifier 19. After the gate 36 is closed, the sense amplifier 19 amplifies data and transmits the data to a pad 18 at the same time that the sense amplifier 34 reads data from the memory cell 15.

Figure 11:
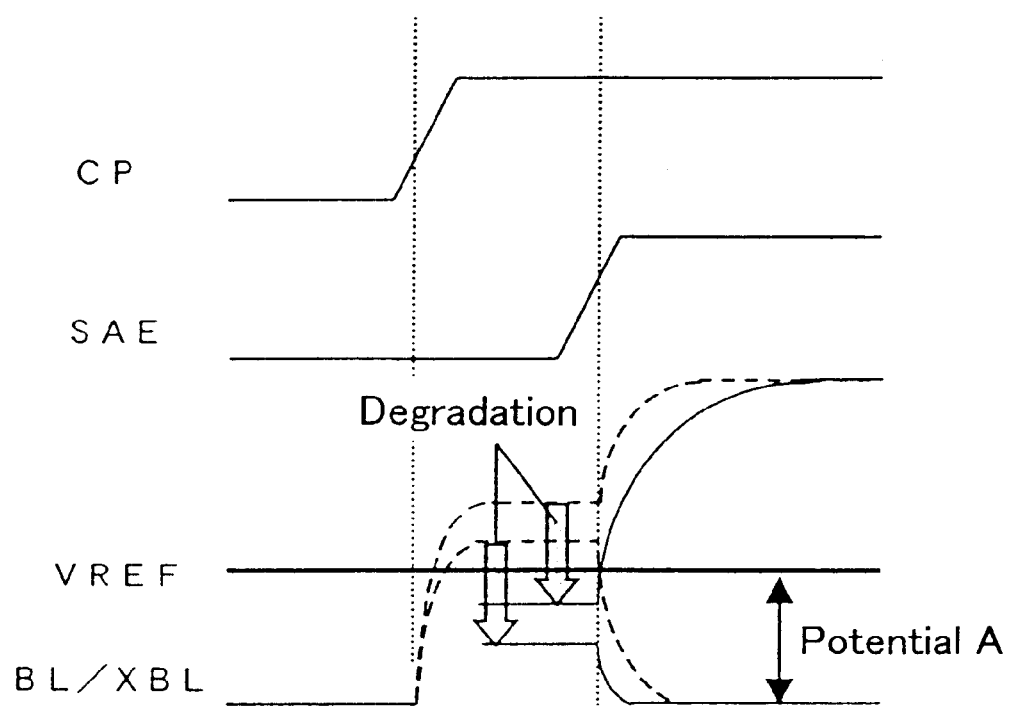
FIG. 11 shows the relationship between the degradation of the characteristics of a ferroelectric memory cell and a bit line potential during reading.

To the sense amplifier 34, a reference potential VREF from the reference potential generator 33 is input. The reference potential VREF has a potential for detecting the degradation of data retention characteristics of the memory cell 15. The degradation of data retention characteristics of the memory cell 15 reduces a read potential that is applied to the bit line pair 16 while reading data. FIG. 11 shows such a reduction in the read potential due to the degraded characteristics. In FIG. 11, the reference potential VREF takes a potential A; a broken line and solid line each represents the read potential of the bit line pair 16 (BL/XBL) before and after an imprint phenomenon occurs.

Figure 12:
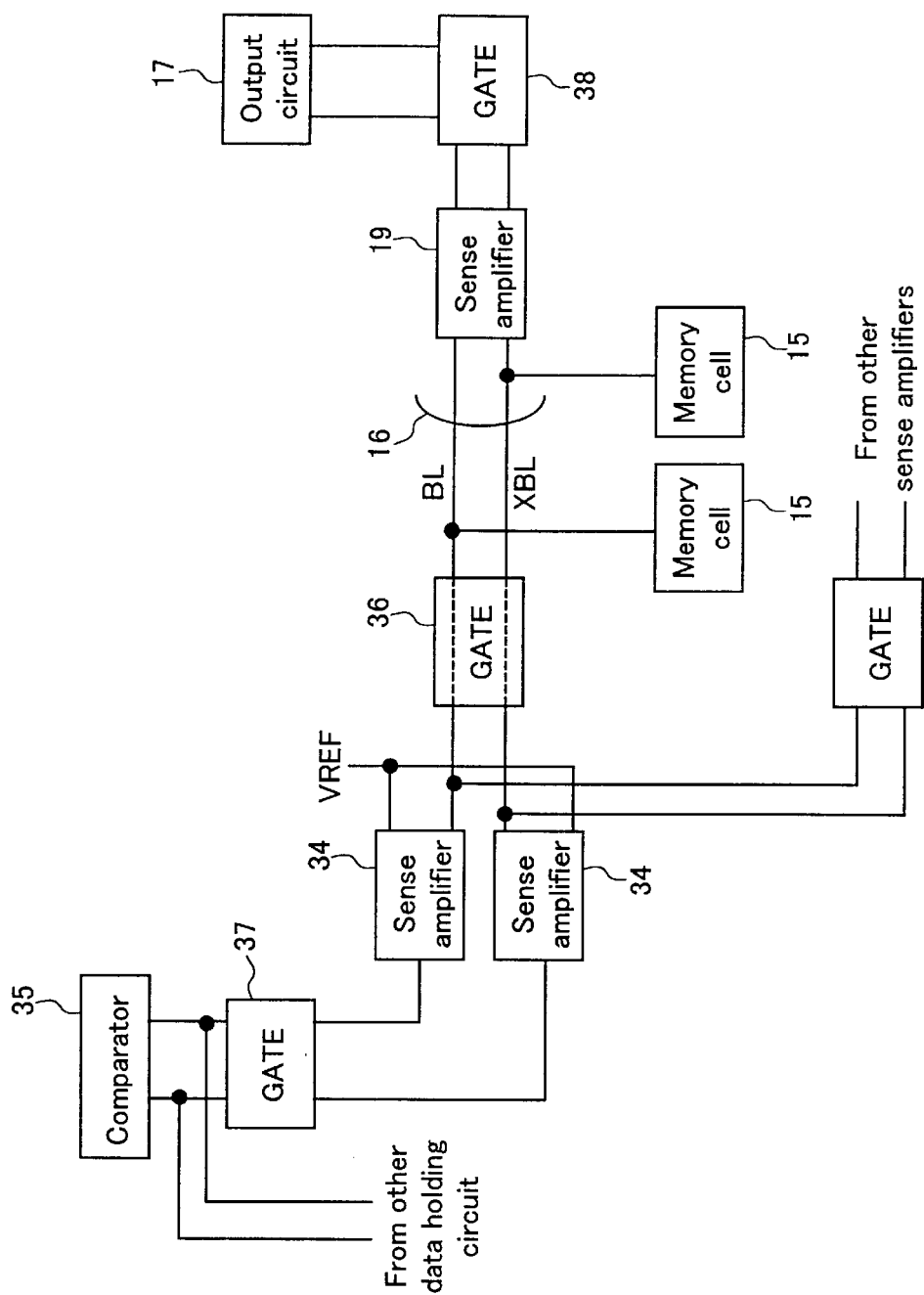
FIG. 12 is a block diagram partially showing the configuration of a semiconductor memory device of a third embodiment of the present invention.

After the sense amplifier 34 reads data from the memory cell 15, the gate 37 connects the comparator 35 and the sense amplifier 34. When the degradation of data retention characteristic progresses in the memory cell 15, the data read from the memory cell 15 are not equal to an expected value at the comparator 35, and thus this can be recognized as degradation. For example, the sense amplifiers 34 are each placed on the complementary bit lines BL/XBL, constituting a bit line pair, as shown in FIG. 12. In the case where neither of data read by the sense amplifiers 34 agrees with the expected value, the degradation is considered to have occurred. Here, a plurality of sense amplifiers 19 can share the same sense amplifier 34. The gate 37 may be selected at the same time that the gate 36 is selected.

When neither of read data agrees with the expected value, i.e., the occurrence of the degradation is detected, the comparator 35 causes an output signal 39 to transit in the same manner as that in first embodiment. The power supply circuit 3 increases the level of the internal supply voltage VINT1 according to the transition of the output signal 39.

Figure 13:
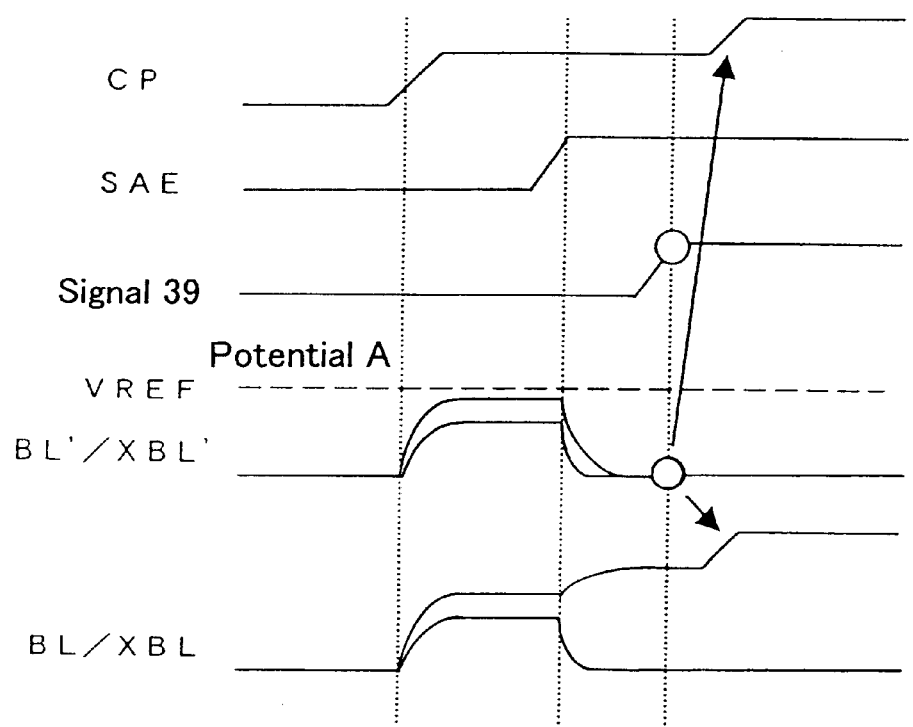
FIG. 13 is a timing chart showing a write operation of a third embodiment of the present invention.

However, in this embodiment, a higher data write voltage is applied to the degraded memory cell alone. Therefore, the internal supply voltage VINT1 is increased within a data read cycle in which the degradation is detected. FIG. 13 shows the sequence of a data write operation in detecting the degradation. In FIG. 13, BL'/XBL' indicates the read potential of a complementary bit line pair when the degradation is not compensated. Here, the compensation for degradation is such that a cell plate CP potential, i.e., a data write voltage is increased based on the transition of the signal 39 from "L" to "H" with the detection of degradation, represented by "round mark". Also, BL/XBL indicates the read potential of a complementary bit line pair when the degradation is compensated.

In this case, the power supply circuit 3 increases the internal supply voltage VINT1, like the first embodiment. However, it does not change the level of the internal supply voltage VINT2.

As described above, this embodiment provides the reference potential generator 33 and, in addition to the sense amplifier 19 for transmitting data, the sense amplifier 34 for reading data from the memory cell to which a reference potential VREF is input. Thus, the data of the selected memory cell can be amplified and transmitted at the same time that the degradation of data retention characteristics of the selected memory cell can be detected. This allows a write voltage to be adjusted according to the degree of degradation of the characteristics of the selected memory cell itself, thereby preventing poor characteristics in terms of reliability resulting from a deficiency of writing due to the degradation of data retention characteristics.

Fourth Embodiment

Figures 14A, 14B:
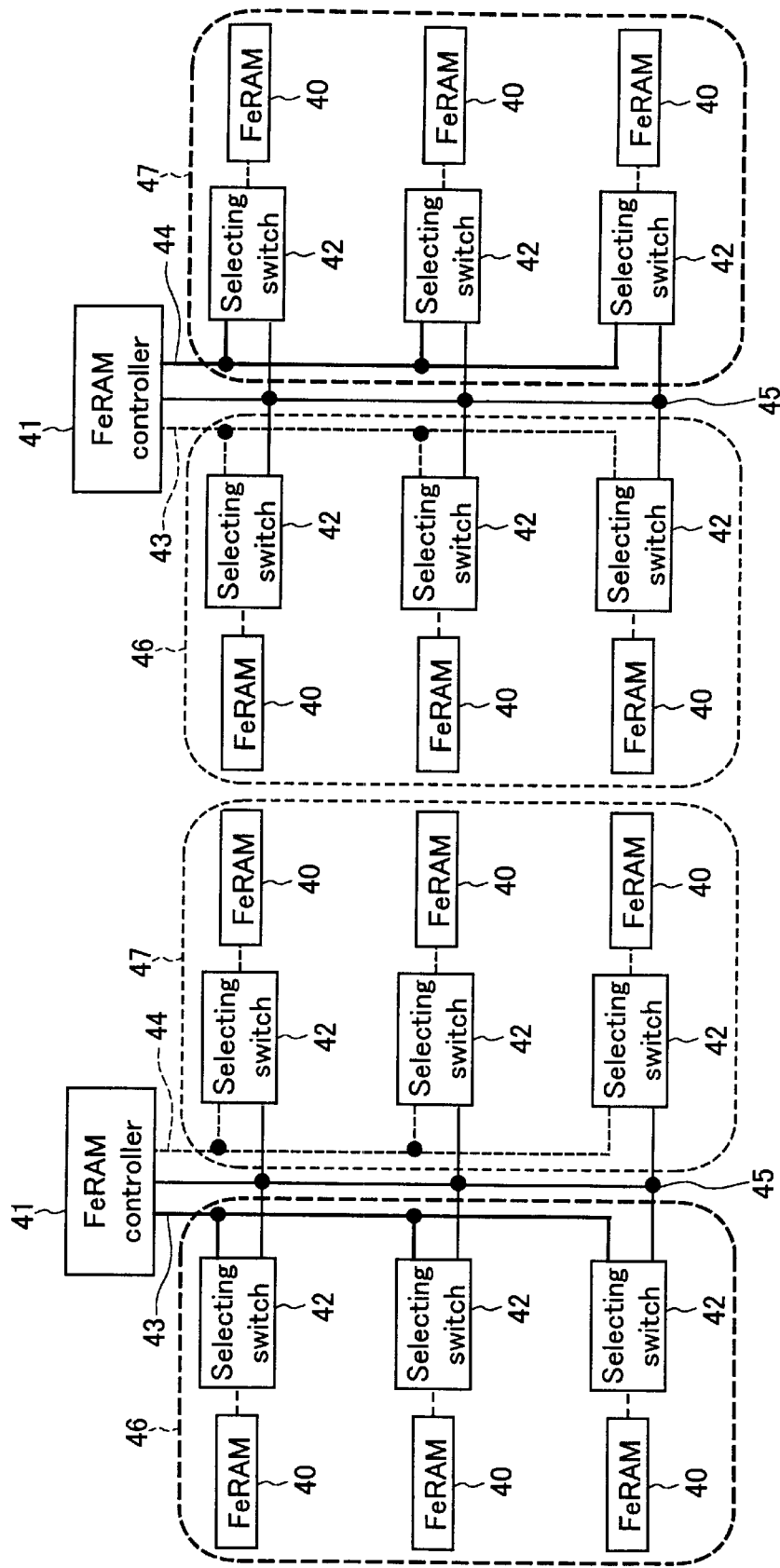
FIG. 14A shows the configuration of a semiconductor memory device of a fourth embodiment of the present invention in selecting a group 46.
FIG. 14B shows the configuration of a semiconductor memory device of a fourth embodiment of the present invention in selecting a group 47.
Figure 15:
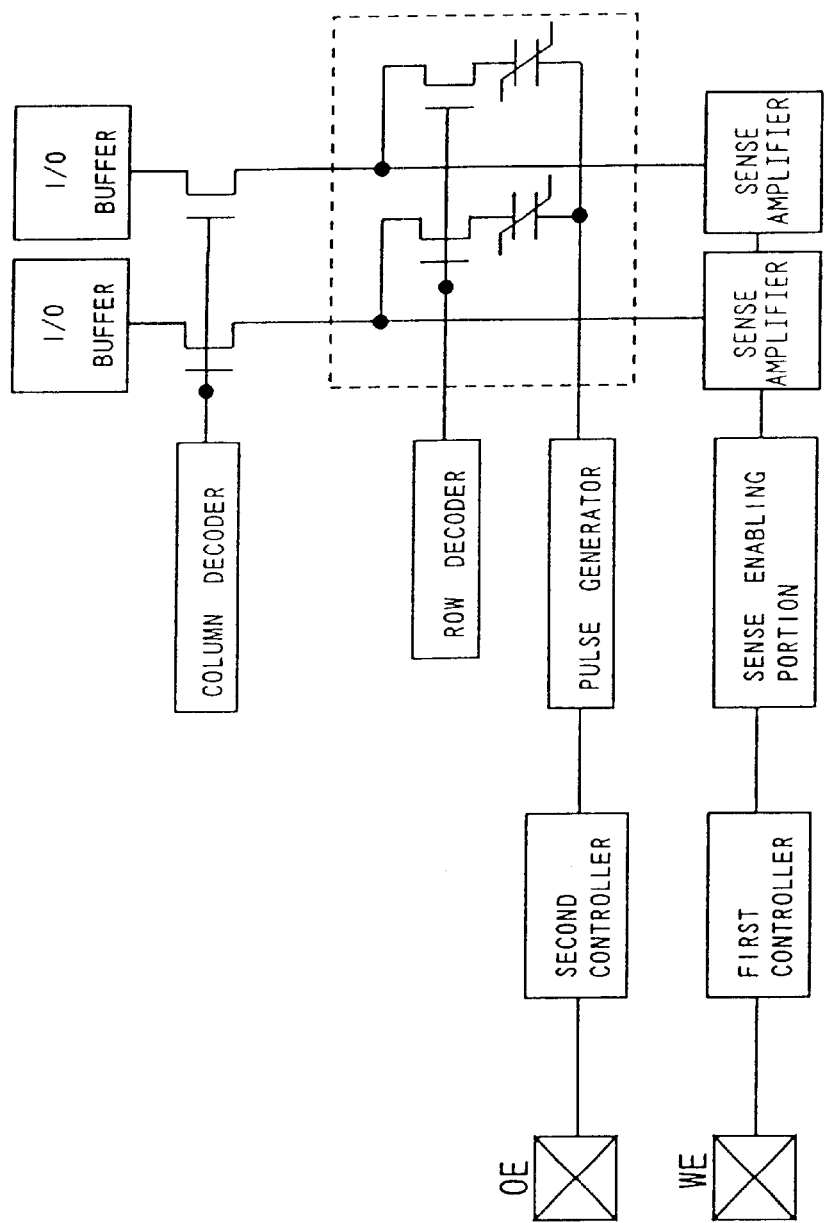
FIG. 15 is a block diagram showing the configuration of a conventional semiconductor memory device.

FIGS. 14A and 14B are block diagrams, each showing an example of the configuration of a semiconductor integrated device of a fourth embodiment of the present invention.

Referring to FIGS. 14A and 14B, a semiconductor integrated device of this embodiment includes a plurality of ferroelectric memories (FeRAM) 40 having different timings of use, an FeRAM controller 41, selecting switches 42 for the FeRAM 40, select lines 43, 44, and a data line 45 containing, e.g., an address signal or I/O signal to be input/output on the FeRAM 40.

The FeRAM 40 are classified into two groups depending on the timing of use: a group 46 and group 47. The group 46 is used first, while the group 47 is used instead of the group 46 after the ferroelectric memories are degraded. The FeRAM 40 have the same configuration as that of the semiconductor memory device shown in FIG. 1, 9, or 10.

Next, the operation of a semiconductor integrated device having the above configuration will be described.

At the beginning of use, only group 46 is selected and operated by the FeRAM controller 41. In the group 46, e.g., a degradation detector, which performs the reading of data for each operation, detects the degradation of data retention characteristics of the FeRAM 40. However, in this embodiment, when the degradation is detected, the internal supply voltage VINT2 to be supplied to a control circuit 20 and output circuit 17 is stepped down. For the detection of degradation, in the FeRAM 40 of the group 46, the level of the internal supply voltage VINT2 is lowered, and the data output timing, i.e., access time is delayed by the lowered level of voltage. Such a reduction in the voltage level and access delay are transmitted through the data line 45 to the FeRAM controller 41, where those factors are detected as the degree of degradation progress.

In the side of the FeRAM controller 41, the degree of the progress of fatigue and degradation is detected with either of the following methods: one method is such that, using test modes as shown in the second embodiment, the degree of degradation progress is confirmed by the level of the internal power supply voltage VINT2 and access delay; the other method is such that, without using the test modes, the degree of degradation progress is confirmed by a parity bit at any time for each operation.

The FeRAM 40 and the FeRAM controller 41 are used to detect the degree of degradation progress, particularly, associated with fatigue endurance of the ferroelectric memory. Consequently, the FeRAM device presenting a larger degree of degradation progress is stopped using and switched to another FeRAM device to use it. This operation is described below.

As shown in FIG. 14A, first, the FeRAM 40 of the group 46 are selected to operate, and then data from these memories are detected by the FeRAM controller through the data line 45 so as to confirm the degradation progress. When the degradation is detected, the select line 44 is activated instead of the select line 43, as shown in FIG. 14B. Thus, the FeRAM 40 of the group 47 are selected to operate, while the FeRAM 40 of the group 46 become unselected to stop operating.

As described above, this embodiment provides a plurality of FeRAM 40 that can output the degree of degradation of a ferroelectric memory cell to the outside of a chip and the FeRAM controller 41 that detects the degree of degradation of the ferroelectric memory cell and selects the FeRAM to be used. Thus, the FeRAM device whose characteristics have been degraded can be detected to stop using, and then another FeRAM device, which has not operated by then, can be used instead. Therefore, the long-term maintenance-free operation can be achieved with a nonvolatile memory set whose characteristics can be degraded.

As described above, in the present invention, a ferroelectric memory cell can perform polarization reversal sufficiently during reading/writing data, even after the memory cell characteristics are degraded by imprint or the like, under a variety of working conditions after the ferroelectric memory actually has been shipped as a product. This ensures the rewriting of data as well as the period of data retention. Thus, the present invention has the remarkable advantage of being able to provide a method and circuit that can compensate for the various types of fatigue and degradation, including an imprint phenomenon.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device comprising:
   a memory cell degradation detector having a first data holding circuit comprising an element formed of ferroelectric;
   a memory cell array having a second data holding circuit comprising an element formed of ferroelectric, and
   a power supply circuit portion for receiving an output signal from the memory cell degradation detector and supplying an internal supply voltage to the memory cell array,
   wherein the power supply circuit portion changes a value of the internal supply voltage based on the output signal from the memory cell degradation detector.

2. The semiconductor memory device according to claim 1, wherein the internal supply voltage has two or more values, and the power supply circuit portion switches the values of the internal supply voltage successively based on the output signal from the memory cell degradation detector.

3. The semiconductor memory device according to claim 1, wherein the value of the internal supply voltage is lower than that of an external supply voltage.

4. The semiconductor memory device according to claim 1, wherein the first data holding circuit is provided with a plurality of data holding circuits, each of which comprises a data holding element pair formed of ferroelectric and a data read line pair connected to each of the data holding element pair and has a different capacitance ratio of the data holding element pair to the data read line pair.

5. The semiconductor memory device according to claim 4, wherein each of the data holding circuits has a different capacitance value of the data holding element pair.

6. The semiconductor memory device according to claim 4, wherein each of the data holding circuits has a different capacitance value of the data read line pair.

7. The semiconductor memory device according to claim 1, wherein
   the first data holding circuit comprises a first data holding element pair formed of ferroelectric, a first data read line pair connected to each of the first data holding element pair, and a first data amplifier for receiving a signal through the first data read line pair,
   the second data holding circuit comprises a second data holding element pair formed of ferroelectric, a second data read line pair connected to each of the second data holding element pair, and a second data amplifier for receiving a signal through the second data read line pair,
   a capacitance ratio of one element of the first data holing element pair to one line of the first data read line pair is the same as that of one element of the second data holding element pair to one line of the second data read line pair, and a capacitance ratio of the other element of the first data holding element pair to the other line of the first data read line pair is different from that of the other element of the second data holding element pair to the other line of the second data read line pair.

8. The semiconductor memory device according to claim 7, wherein a capacitance value of one line of the first data read line pair is the same as that of one line of the second data read line pair, and a capacitance value of the other line of the first data read line pair is smaller than that of the other line of the second data read line pair.

9. The semiconductor memory device according to claim 1, wherein the first data holding circuit comprises a plurality of first data holding elements formed of ferroelectric and a plurality of data read lines connected to the first data holding elements, and reading/writing of data with respect to the first data holding elements are performed only when a power is turned on.

10. The semiconductor memory device according to claim 1, wherein the first data holding circuit comprises a plurality of first data holding elements formed of ferroelectric and a plurality of data read lines connected to the first data holding elements, and reading/writing of data with respect to the first data holding elements are performed when a power is turned on and when data are read from and written into the memory sell array.

11. The semiconductor memory device according to claim 1, wherein the first data holding circuit comprises a first data holding element formed of ferroelectric, a first data read line connected to the first data holding element, a third data holding element formed of ferroelectric, and a third data read line connected to the third data holding element, and reading/writing of data with respect to the first data holding element are performed only when a power is turned on, while the reading/writing of data with respect to the third data holding element are performed when the power is turned on and each time data are read from and written into the memory cell array.

12. The semiconductor memory device according to claim 11, wherein the data to be written into the first and third data holding elements are constant regardless of data input externally to the memory cell array.

13. The semiconductor memory device according to claim 1, wherein the first data holding circuit comprises a first data holding element formed of ferroelectric, a first data read line connected to the first data holding element, a third data holding element formed of ferroelectric, and a third data read line connected to the third data holding element, reading/writing of data with respect to the first data holding element are performed only when a power is turned on, while the reading/writing of data with respect to the third data holding element are performed when the power is turned on and each time data are read from and written into the memory cell array, and after the reading/writing of data with respect to the first and third data holding elements in turning the power on, a refresh operation is performed for the memory cell.

14. The semiconductor memory device according to claim 13, wherein the data to be written into the first and third data holding elements are constant regardless of data input externally to the memory cell array.

15. The semiconductor memory device according to claim 1, wherein the power supply circuit portion comprises an input circuit for recognizing a voltage level of an external signal, a first means for outputting the internal supply voltage to the outside of a chip, and a second means for transmitting the internal supply voltage to the first means based on an output signal from the input circuit, and a value of the internal supply voltage is changed in accordance with the voltage level of the external signal.

16. A semiconductor integrated device comprising:

a plurality of semiconductor memory devices, each comprising a memory cell degradation detector having a first data holding circuit comprising an element formed of ferroelectric, a memory cell array having a second data holding circuit comprising an element formed of ferroelectric, and a power supply circuit portion for changing a value of an internal supply voltage to be supplied to the memory cell array based on an output signal from the memory cell degradation detector, the semiconductor integrated device further comprising a selecting circuit, to which data signals from the semiconductor memory devices are coupled, for selecting any one of the semiconductor memory devices and a control circuit for controlling the selecting circuit so that an unselected semiconductor memory device is selected based on the data signal from the semiconductor memory device selected by the selecting circuit.

* * * * *